United States Patent [19]

Buchalter et al.

[11] Patent Number: 4,573,027

[45] Date of Patent: Feb. 25, 1986

[54] BULK ACOUSTIC RESONATOR TRACKING FILTER

[75] Inventors: Michael S. Buchalter, Laurel; Francis W. Hopwood, Severna Park; James T. Haynes, Pasadena, all of Md.

[73] Assignee: The United States of America as represented by the Secretary of the Air Force, Washington, D.C.

[21] Appl. No.: 615,502

[22] Filed: May 30, 1984

[51] Int. Cl.[4] .................. H03G 11/04; H03H 9/00
[52] U.S. Cl. ................. 333/17 R; 333/187; 333/188; 310/343; 330/110; 330/294
[58] Field of Search ............ 333/17 R, 18, 187, 188, 333/174, 175, 167, 234; 331/1 R, 16, 17, 34, 107 A, 154, 155, 158; 330/294, 303, 86, 85, 110, 99, 101, 102, 103, 106; 310/343; 358/184

[56] References Cited

U.S. PATENT DOCUMENTS

| | | | |
|---|---|---|---|
| 2,166,088 | 5/1939 | Runge | 333/17 R |
| 3,013,224 | 12/1961 | King | 333/18 |
| 3,170,120 | 2/1965 | Jensen et al. | 330/117 |
| 3,349,348 | 10/1967 | Ice | 333/188 |
| 3,355,681 | 11/1967 | Burrier et al. | 333/18 X |
| 3,588,752 | 6/1971 | Hirshfeld | 333/17 R |
| 3,668,560 | 6/1972 | Trigg | 333/17 R |
| 3,715,690 | 2/1973 | Young et al. | 333/17 R |
| 3,832,536 | 8/1974 | Le Dily et al. | 330/110 X |
| 3,868,605 | 2/1975 | Poole | 333/176 |
| 3,936,830 | 2/1976 | Overbury | 333/174 X |
| 4,074,213 | 2/1978 | Epsztein et al. | 333/187 |
| 4,119,922 | 10/1978 | Schroder | 330/86 |
| 4,320,365 | 3/1982 | Black et al. | 333/187 |
| 4,341,999 | 7/1982 | Rudish et al. | 333/18 X |
| 4,426,630 | 1/1984 | Folkmann | 333/17 R X |

Primary Examiner—Eugene R. LaRoche
Assistant Examiner—Benny T. Lee
Attorney, Agent, or Firm—Donald J. Singer; Willard R. Matthews

[57] ABSTRACT

This invention is directed to a narrow band filter for eliminating out-of-band noise in the oscillator signal of a doppler radar system. It provides a very high Q filter derived from a Bulk Acoustic Resonator's (BAR) high Q, L-Band response and uses thermal feedback to lock the BAR's response band onto the input frequency. The BAR is a very narrow band filter with a Q near 40,000 and a comblike frequency response having passbands occurring every 5 MHz, approximately. The comblike response of the BAR shifts down 60 KHz for every 1° C. rise in temperature. In this invention a frequency sensitive heater is used to move the response comb of the BAR up or down in accordance with changes in the frequency of the incoming signal. The input frequency can be allowed to drift and the heat source will produce more heat or less heat, keeping the response right at the input frequency.

1 Claim, 9 Drawing Figures

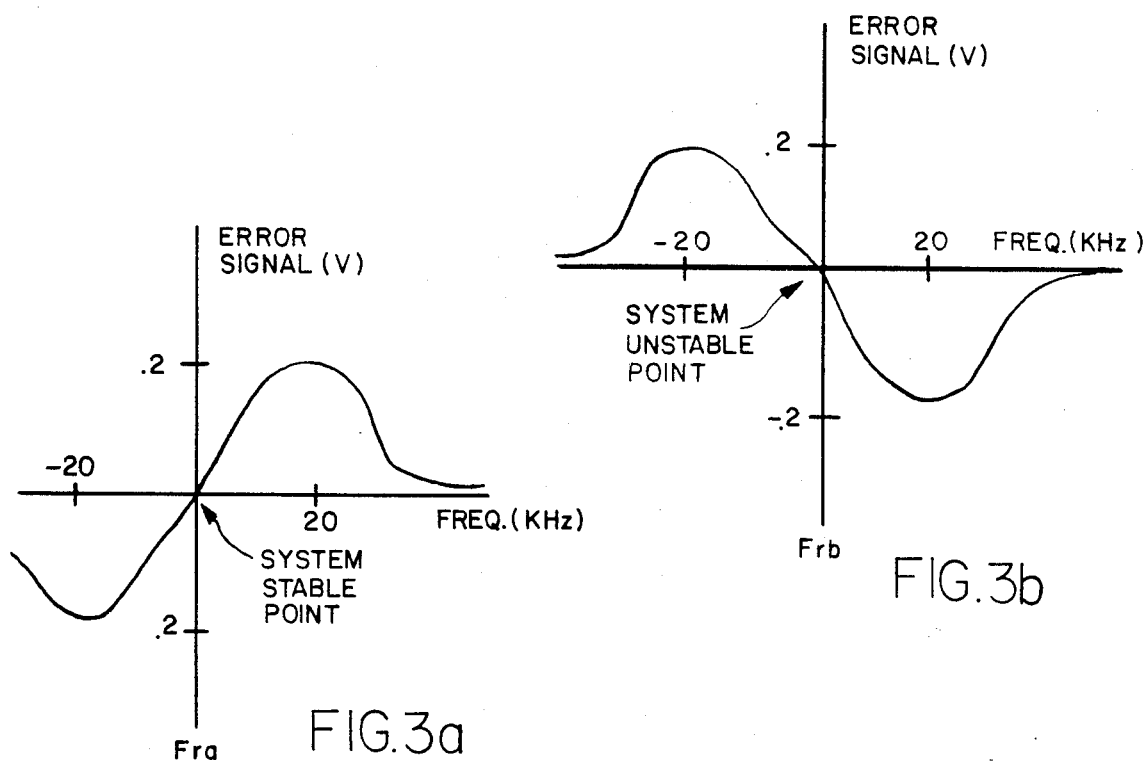
FIG. 3a
FIG. 3b
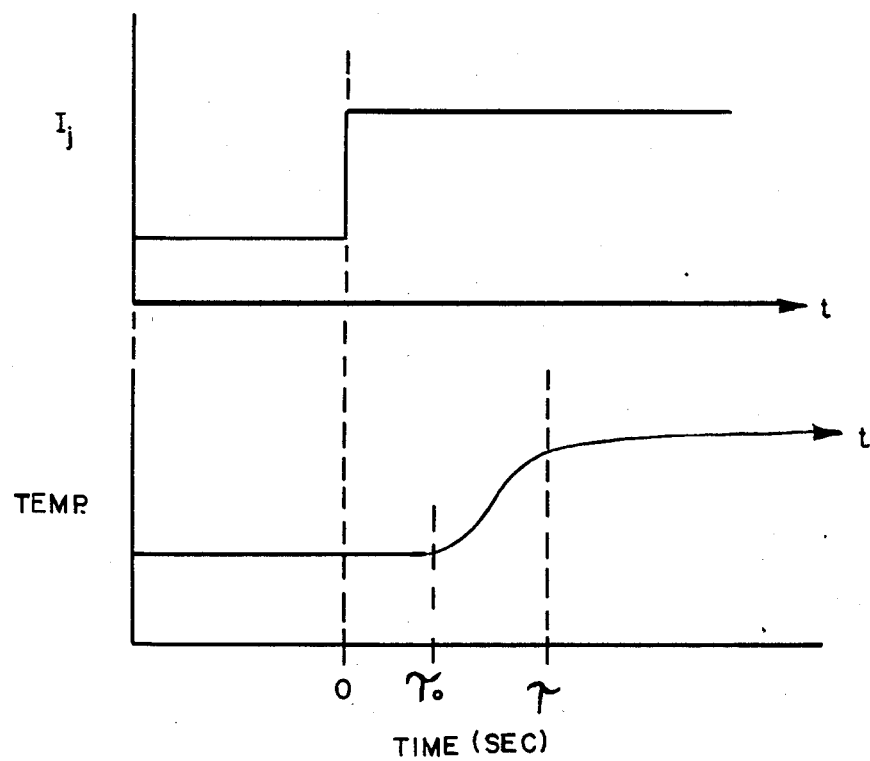
FIG. 4

BULK ACOUSTIC RESONATOR TRACKING FILTER

STATEMENT OF GOVERNMENT INTEREST

The invention described herein may be manufactured and used by or for the Government for governmental purposes without the payment of any royalty thereon.

BACKGROUND OF THE INVENTION

The invention relates generally to tracking filters for eliminating out-of-band noise in radar systems and specifically to a frequency mobile narrow band filter used to move and lock a Bulk Acoustic Resonator's response to the frequency of incoming signals.

Bulk Acoustic Resonators have a history of poor thermal stability with their responses changing critically with comparatively mild changes of thermal conditions. In one instance, a particular Bulk Acoustic Resonator's response signal was observed to move down approximately 60 KHz for every 1° C. rise in temperature. With an operating bandwidth of 40 KHz there resulted a strong danger of the complete loss of the tracking signal.

The problem of thermal effects on frequency responses in radar teaching components has been alleviated to some degree by the prior art techniques given by the following patents:

U.S. Pat. No. 4,074,213 issued to Epsztein et al on Feb. 14, 1978;

U.S. Pat. No. 4,320,365 issued to Black et al on Mar. 16, 1982;

U.S. Pat. No. 3,170,120 issued to Jensen et al on Feb. 16, 1965;

U.S. Pat. No. 3,868,605 issued to Poole on Feb. 25, 1975; and

U.S. Pat. No. 3,349,348 issued to Ice on Oct. 24, 1967.

Epsztein et al disclose an elastic bulk wave used to filter an electrical signal having a plurality of frequency components. The patented device forms an acoustic bulk wave filter for high frequency oscillator applications. A bulk acoustic wave resonator and filter construction is shown in Black et al. Jenson et al disclose a comb filter and Poole is directed to an adaptable notch filter. Temperature compensation for a quartz crystal filter is suggested in the Ice patent.

While the above prior art techniques are instructive, the problem remains for Bulk Acoustic Resonators having a very narrow band of frequency response coupled with changes in frequency in incoming signals. In view of the foregoing discussion, it is apparent that there currently exists the need for moving the response comb of the Bulk Acoustic Resonator up or down in accordance with changes in the frequency of the incoming signals. The present invention is directed towards satisfying that need.

SUMMARY OF THE INVENTION

This invention provides a means of moving the response comb of a Bulk Acoustic Resonator up or down in accordance with changes in the frequency of incoming signals by taking advantage of what has been historically catagorized as a problem area for all Bulk Acoustic Resonators; their response to changing thermal conditions.

As mentioned above, the responses of Bulk Acoustic Resonators change critically with comparatively mild changes of temperature. In this invention a frequency sensitive heater is used to move the response comb of the Bulk Acoustic Resonator (BAR) up or down in accordance with changes in the frequency of the incoming signal.

The "frequency sensitive heater" approach is implemented by connecting the Bulk Acoustic Resonator with a power splitter, a phase shifter, a phase detector, a video amp, and an electrical heater. The power splitter divides the incoming signal, sending it to the BAR and to the phase shifter. The phase shifter shifts the incoming signal by 90° and sends the shifted signal to the phase detector. The phase detector compares the signal received from the BAR with the shifted signal and send an error signal to the video amplifier, which in turn sends the amplified signal to the heater. The heater is placed in proximity with the BAR and by increasing or decreasing the thermal output, it shifts the response of the BAR.

It is an object of the invention to provide a frequency mobile narrow band filter for eliminating out-of-band noise in the oscillator signal of a doppler radar system.

It is another object of the invention to provide a means of moving and locking a Bulk Acoustic Resonator's response to the frequency of incoming signals.

These together with other objects, features and advantages of the invention will become more readily apparent from the following detailed description when taken in conjunction with the accompanying drawing wherein like elements are given like reference numerals throughout.

DESCRIPTION OF THE DRAWINGS

FIGS. 3a and 3b are comparative graphs showing a stable resonant point at frequency $F_{ra}$ and an unstable resonant point at $F_{rb}$;

FIG. 4 consists of two graphs showing the heater response to an input step into its control pins;

DETAILED DESCRIPTION OF THE PREFERRED EMBODIMENT

Figure 1:
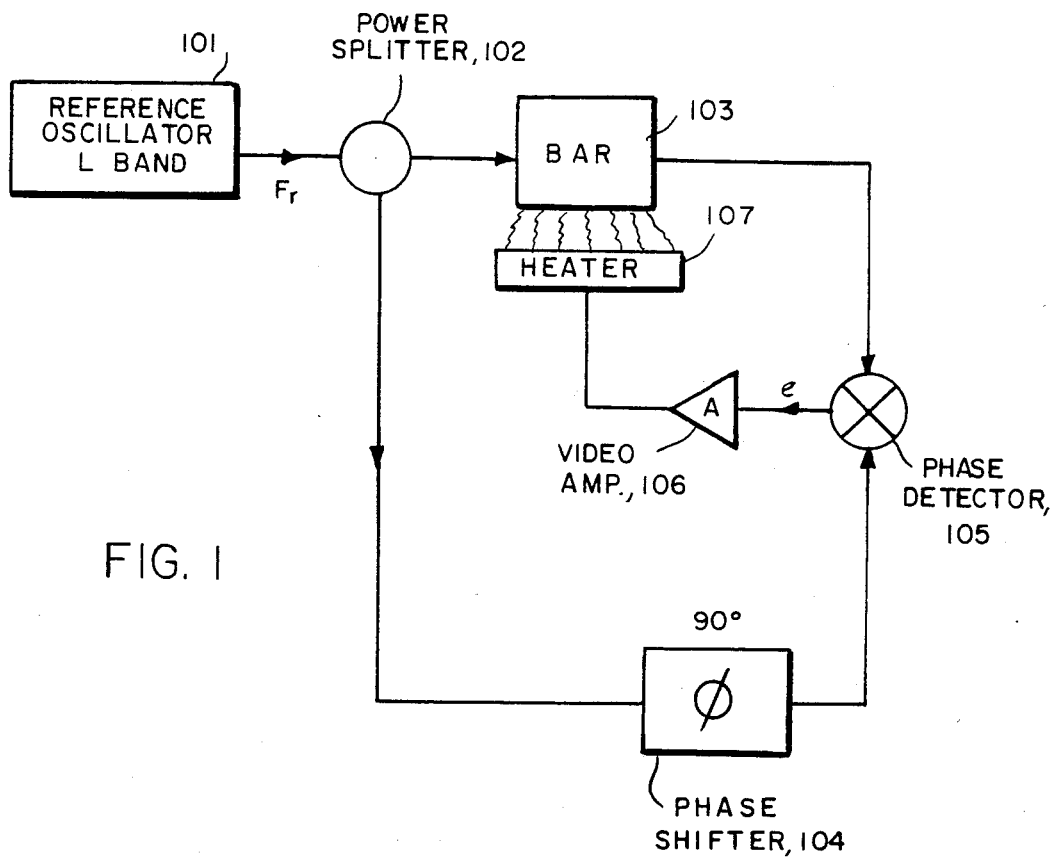
FIG. 1 is a function block diagram of the invention.

This invention is a narrow band filter that attenuates noise on the reference oscillator and tracks the reference oscillator. FIG. 1 is a function block diagram of this invention which uses a frequency sensitive source of heat to move the response comb of the Bulk Acoustic Resonator up or down in a accordance with changes in the frequency of the incoming signal.

In FIG. 1, the reference oscillator 101 sends the incoming signal Fr into the power splitter 102. The power splitter divides the incoming signal, sending it to the Bulk Acoustic Resonator 103 and the phase shifter 104. The phase shifter 104 shifts the incoming signal 90° and sends it to the phase detector 105.

The phase detector 105 receives the shifted incoming signal from the phase shifter 104 and the Bulk Acoustic Resonator's response signal; and generates the error signal e which is amplified by the video amplifier 106 to control the heater 107.

The error signal occurs when the BAR's response band is not centered at frequency Fr. If the response band is lower that Fr, the error signal is negative and the heater will produce less heat. If the response band is greater than Fr the error signal is positive. The heater temperature is always above ambient, making it possible to lower the BAR's temperature.

Figure 2:
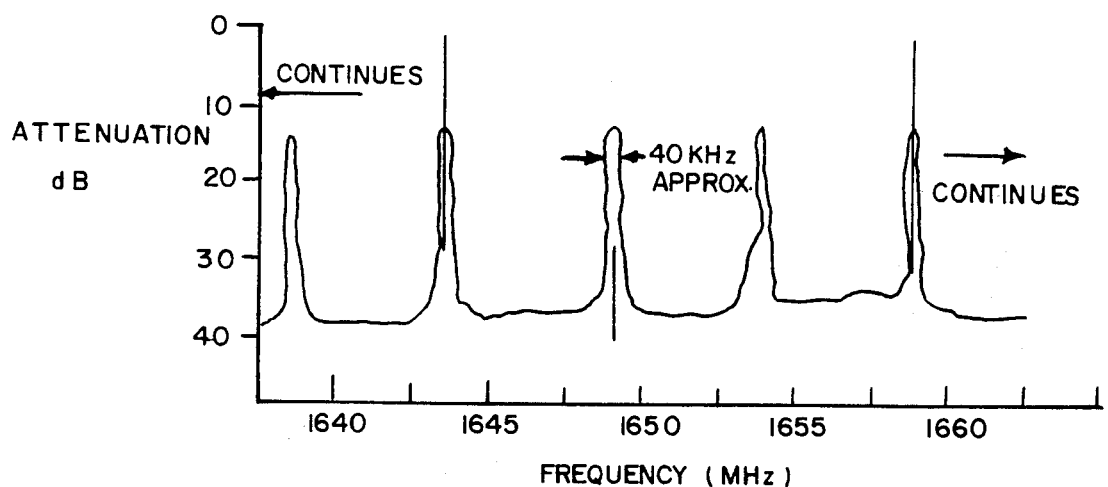
FIG. 2 is a chart illustrating the frequency response of a Bulk Acoustic Resonator.

FIG. 2 is a chart illstustrating the frequency response of a Bulk Acoustic Resonator. The Bulk Acoustic Resonator is a very narrow band filter, with a Q near 40,000. The BAR has a comblike frequency response, with passbands occurring every 5 MHz, approximately. The BAR however, suffers from poor thermal stability. The passbands move down approximately 60 KHz for every 1° C. rise in temperature. Knowing that the passbands are only about 40 KHz wide, the signal could be lost due to a minor temperature fluctuation.

The invention is based on the BAR's comblike frequency response (FIG. 2) consisting of high Q passbands. The comblike response of the BAR shifts down 60 KHz for every 1° C. rise in temperature of the BAR. This temperature instability is put to good use by making the BAR a frequency mobile filter. A heat source is used to move the BAR's response to the frequency of the incoming signal. The input frequency can be allowed to drift and the heat source will produce more heat or less heat keeping the response right at the input frequency.

FIGS. 3a and 3b are comparative graphs showing a stable resonant point at frequency $F_{ra}$ and an unstable resonance point at frequency $F_{rb}$. As shown in FIG. 3 not every resonant response of the BAR's comblike response is stable for this system. Every other response is stable because the BAR's output phase is either 0° or 180° different than the input phase to the BAR depending on whether an even or an odd resonance is used.

FIG. 4 consists of two graphs showing the heater 107 of FIG. 1 response to the input step into the control pins of the heater. As illustrated in FIG. 1, the heater 107 uses the amplified error signal from the video amplifier 106 as a heat control signal. The heater is operated above ambient temperature and below its maximum attainable temperature to provide good upward and downward mobility of the BAR's temperature. The Watkins-Johnson WJ-331240-001 d.c. controlled heater was used in one embodiment of the system. The WJ heater uses a control resistor on the order of 10K to 20K ohms to provide constant temperature output. The system of FIG. 1 injects some current $I_j$ into one of the control pins of the heater. This simulates changing the control resistor. Using input step response tests on the heater, the heater could be modeled as a low pass filter having a delay time (FIG. 4). The delay time was about 1.50 sec, and the time constant was 5.5 sec.

Figure 5:
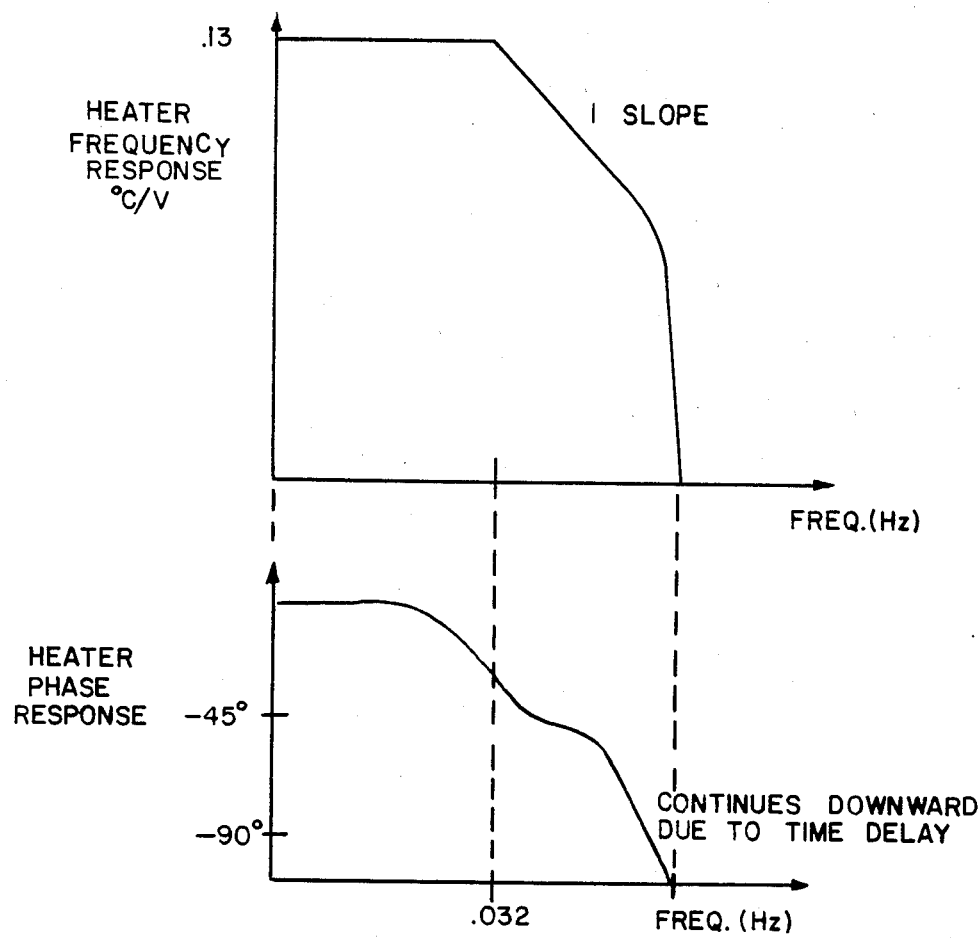
FIG. 5 consists of two graphs showing the frequency and phase response of the heater obtained from the step response.

Shown in FIG. 5 is the frequency and phase response of the heater obtained from the step response. The delay time results in large phase and magnitude losses at frequencies greater than 0.032 $H_z$. This limits the loop response to 0.10 hz, where the phase loss around the loop is 130°.

The purpose of the video amplifier 106, of FIG. 1, will be to limit the loop response to 0.032 $H_z$, and provide gain at frequencies below 0.032 $H_z$.

Figure 6:
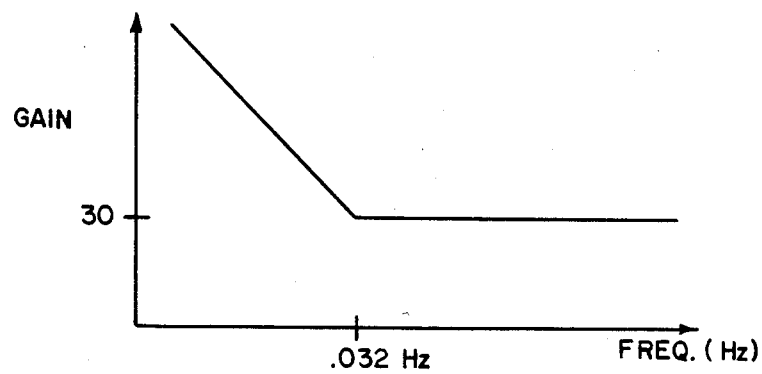
FIG. 6 is a graph of the video amplifier frequency response.

FIG. 6 is a graph of the video amplifier frequency response. The break frequency of 0.032 hz matches the heater break frequency shown in FIG. 5.

Figure 7:
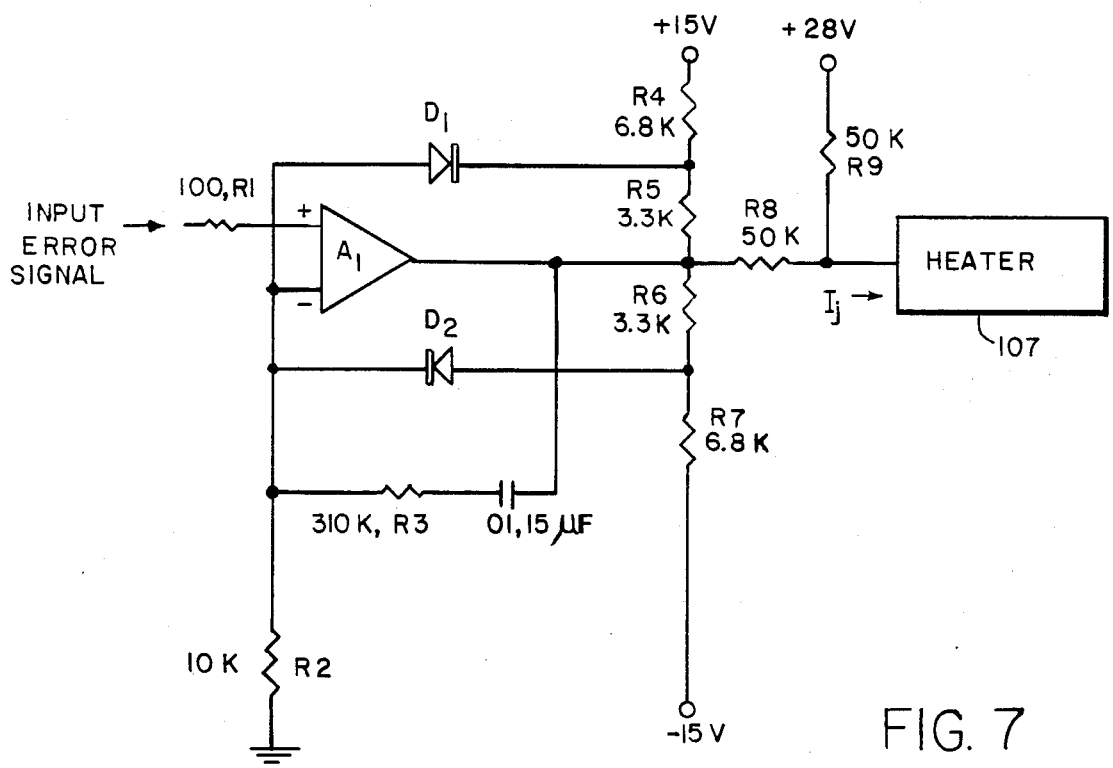
FIG. 7 is a diagram of the circuit of the video amplifier.

FIG. 7 is a diagram of the circuit of the video amplifier 106. The video amplifier circuit consists of nine resistors $R_1$-$R_9$, an amplifier A, two diodes $D_1$-$D_2$, and one capacitor $C_1$.

The input error signal is conducted by resistor $R_1$, into the noninverting input terminal of amplifier $A_1$. Resistors $R_2$ connects the inverting input terminal of amplifier A, with a common electrical ground.

The output terminal of amplifier A, is connected to its inverting input thermal by capacitor $C_1$ and resistor $R_3$. The output terminal is connected to a positive voltage source of 15 volts by resistors $R_4$ and $R_5$; and to a negative voltage source of $-15$ volts by resistors $R_6$ and $R_7$. Diode $D_1$ connects the inverting input terminal of amplifier A, to the junction between resistors $R_4$ and $R_5$. Diode $D_2$ connects the inverting input terminal of amplifier $A_1$ to the junction between resistors $R_6$ and $R_7$.

The output terminal of amplifier A, is connected to the junction between resistors $R_5$ and $R_6$ which in turn is connected to heater 107 by resistor $R_8$. The junction between the heater 107 and resistor $R_8$ is connected to a positive voltage source of 28 volts by resistor $R_9$.

The frequency response for the video amp is shown in FIG. 6. The break frequency of 0.032 hz matches the heater break frequency. This produces a loop response (FIG. 8) which is a 1 slope until the time delay of the heater attenuates the loop gain above 0.10 hz.

Figure 8:
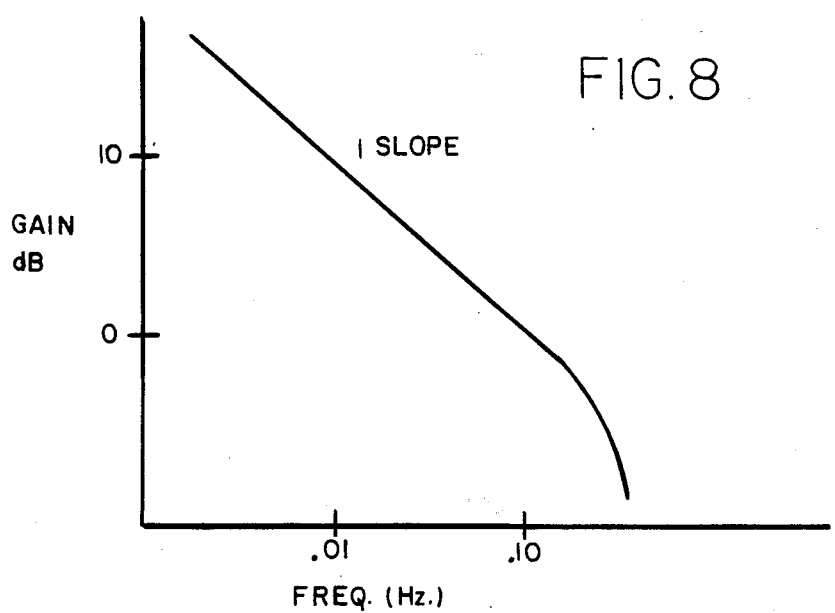
FIG. 8 is a graph showing the loop response resulting from the matching of the heater break frequency with the video amplifier frequency.

The video amp high frequency gain of 30 is chosen to provide a closed loop gain of unity at 0.10 hz (FIG. 8). The loop should be stable with a unity gain frequency of 0.10 hz, because the phase shift around the loop at this frequency is less than 180°.

The above described invention has the capability of moving the response comb of a Bulk Acoustic Resonator up or down in accordance with changes in the frequency of incoming signals.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. In combination with a Bulk Acoustic Resonator which receives incoming signals over an input terminal, and produces response signals over an output terminal, and in combination with a signal source having an output terminal and producing said incoming signals over its output terminal, a frequency mobile filter which receives and conducts said incoming signals from the output terminal of said signal source to the input terminal of the Bulk Acoustic Resonator, said frequency mobile filter dynamically heating said Bulk Acoustic Resonator to thermally adjust its response signals so that frequencies of said response signals match frequencies of said incoming signals, said frequency mobile filter comprising:

a first and second positive voltage source;

a negative voltage source;

a power splitter having an input terminal and first and second output terminals, said power splitter receiving said incoming signals on its input terminal from the output terminal of said signal source, said power splitter producing first and second split signals respectively over its first and second output terminals by splitting said incoming signals, said first output terminal conducting said first split signals to the input terminal of said Bulk Acoustic Resonator;

a phase shifter having an input and output terminal, said phase shifter receiving said second split signals on its input terminal from the second output terminal of said power splitter, said phase shifter producing phase shifted signals over its output terminal by shifting said second split signals by ninety degrees;

a phase detector having first and second input terminals and an output terminal, said phase detector receiving said phase shifted signals on its first input terminal from said output terminal of said phase shifter, said phase detector receiving said response signals on its second input terminal from the output terminal of said Bulk Acoustic Resonator, said phase detector outputting an error signal over its output terminal when said response signals of said Bulk Acoustic Resonator are not centered at the frequency of said phase shifted signals, said error signal indicating any amount of mismatch between the frequencies of said phase shifted signals and said response signals;

an operational amplifier having an inverting input terminal, a noninverting input terminal, and an output terminal, said operational amplifier receiving said error signal on its noninverting input terminal and producing an amplified error signal on its output terminal;

a first resistor conducting said error signal from the output terminal of said phase detector into the noninverting input terminal of said operational amplifier;

a second resistor connecting said operational amplifier's inverting input terminal with a common electrical ground;

a capacitor connected to the output terminal of said operational amplifier;

a third resistor connecting said capacitor in series with said operational amplifier's inverting input terminal;

a first diode having a first and a second terminal, said first diode being forward biased from its first terminal to its second terminal, said first diode having its first terminal connected with said operational amplifier's noninverting input terminal;

a fourth resistor connecting the second terminal of said first diode with said first positive voltage source, said fourth resistor being connected to said second terminal of said first diode by a junction between said fourth resistor and said first diode;

a fifth resistor connecting the junction between said fourth resistor and said first diode with said operational amplifier's output terminal;

a second diode having a first and second terminal, said second diode being forward biased from its first terminal to its second terminal, said second diode having its second terminal connected with said operational amplifier's inverting input terminal;

a sixth resistor connecting said second diode's first terminal with said operational amplifier's output terminal, said sixth resistor being connected to said first terminal of said second diode by a junction between said sixth resistor and said second diode;

a seventh resistor connecting the junction between said second diode and said sixth resistor with said negative voltage source;

a eighth resistor connected with said operational amplifier's output terminal;

a heater having an input terminal which is electrically connected to the output terminal of said operational amplifier by said eighth resistor, said heater receiving said amplified error signal on its input terminal, said heater heating said Bulk Acoustic Resonator at amounts varying with said amplified error signal, said heater thereby thermally adjusting said response signals of said Bulk Acoustic Resonator to match the frequencies of said incoming signals by applying more heat when said amplified error signal indicates that the frequency of said response signals need to be increased to match that of said incoming signals, said heater applying less heat when said error signals indicate the frequency of said response signals need to be decreased to match that of said incoming signals; and a ninth resistor connecting the junction between said eighth resistor and said input terminal with said second positive voltage source.

* * * * *